(12) United States Patent
Hoegerl et al.

(10) Patent No.: US 12,266,586 B2
(45) Date of Patent: *Apr. 1, 2025

(54) DOUBLE-SIDED COOLABLE SEMICONDUCTOR PACKAGE

(71) Applicant: Infineon Technologies AG, Neubiberg (DE)

(72) Inventors: Juergen Hoegerl, Regensburg (DE); Ordwin Haase, Taufkirchen (DE); Tobias Kist, Effeltrich (DE)

(73) Assignee: Infineon Technologies AG, Neubiberg (DE)

( * ) Notice: Subject to any disclaimer, the term of this patent is extended or adjusted under 35 U.S.C. 154(b) by 272 days.

This patent is subject to a terminal disclaimer.

(21) Appl. No.: 17/844,455

(22) Filed: Jun. 20, 2022

(65) Prior Publication Data

US 2022/0319948 A1 Oct. 6, 2022

Related U.S. Application Data

(63) Continuation of application No. 17/147,717, filed on Jan. 13, 2021, now Pat. No. 11,515,228, which is a
(Continued)

(30) Foreign Application Priority Data

Jul. 25, 2018 (DE) .......................... 102018212439.6
Oct. 29, 2018 (DE) .......................... 102018126972.2

(51) Int. Cl.
*H01L 23/367* (2006.01)
*H01L 21/52* (2006.01)
(Continued)

(52) U.S. Cl.
CPC ............ *H01L 23/367* (2013.01); *H01L 21/52* (2013.01); *H01L 21/56* (2013.01);
(Continued)

(58) Field of Classification Search
CPC ............... H01L 23/367; H01L 23/3121; H01L 23/3735; H01L 23/433; H01L 23/492;
(Continued)

(56) References Cited

U.S. PATENT DOCUMENTS 8,358,000 B2 1/2013 Beaupre et al.
8,654,554 B2 2/2014 Seki
(Continued)

FOREIGN PATENT DOCUMENTS

CN 102070695 A 11/2015
CN 107305875 A 10/2017
(Continued)

*Primary Examiner* — Peniel M Gumedzoe
(74) *Attorney, Agent, or Firm* — Murphy, Bilak & Homiller, PLLC

(57) ABSTRACT

A semiconductor package includes an encapsulant body; a first electrically conductive element having an outwardly exposed metal surface; a first carrier substrate having a first electrically conductive layer, a second electrically conductive layer having an outwardly exposed surface, and an electrical insulation layer; a first electrically conductive spacer between the first electrically conductive element and the first electrically conductive layer; a power semiconductor chip between the first electrically conductive element and the first electrically conductive layer; and a second electrically conductive spacer between the first electrically conductive element and the power semiconductor chip, a first carrier region of the first electrically conductive layer is connected to a first power terminal, a second carrier region of the first electrically conductive layer is alongside the first carrier region and is connected to a second power terminal, a first region of the first electrically conductive element is connected to a third power terminal.

13 Claims, 9 Drawing Sheets

Related U.S. Application Data continuation of application No. 16/520,058, filed on Jul. 23, 2019, now Pat. No. 11,018,072.

(51) Int. Cl.
| | |
|---|---|
| *H01L 21/56* | (2006.01) |
| *H01L 23/31* | (2006.01) |
| *H01L 23/373* | (2006.01) |
| *H01L 23/433* | (2006.01) |
| *H01L 23/492* | (2006.01) |
| *H01L 23/495* | (2006.01) |
| *H01L 25/16* | (2023.01) |
| *H01L 29/16* | (2006.01) |
| *H10D 62/832* | (2025.01) |

(52) U.S. Cl.
CPC ...... *H01L 23/3121* (2013.01); *H01L 23/3735* (2013.01); *H01L 23/433* (2013.01); *H01L 23/492* (2013.01); *H01L 23/49524* (2013.01); *H01L 25/16* (2013.01); *H10D 62/8325* (2025.01)

(58) Field of Classification Search
CPC .......... H01L 23/49524; H01L 25/16; H01L 29/1608
See application file for complete search history.

(56) References Cited

U.S. PATENT DOCUMENTS

| | | |
|---|---|---|
| 9,275,926 B2 * | 3/2016 | Hable ................ H01L 23/4334 |
| 10,002,821 B1 | 6/2018 | Hoegerl |
| 10,128,165 B2 | 11/2018 | Hable et al. |
| 10,348,214 B2 | 7/2019 | Nakatsu et al. |
| 11,004,764 B2 | 5/2021 | Hoegerl et al. |
| 11,018,072 B2 | 5/2021 | Hoegerl et al. |
| 2007/0090814 A1 | 4/2007 | Hashimoto et al. |
| 2011/0316143 A1 * | 12/2011 | Noritake ............... H01L 23/473 257/713 |
| 2012/0228757 A1 | 9/2012 | Kitami et al. |
| 2017/0287875 A1 | 10/2017 | Gao et al. |
| 2018/0102302 A1 | 4/2018 | Grassmann et al. |
| 2018/0145007 A1 | 5/2018 | Hatano et al. |
| 2020/0286865 A1 | 9/2020 | Chew et al. |

FOREIGN PATENT DOCUMENTS

| | | |
|---|---|---|
| DE | 102014209690 A1 | 11/2015 |
| DE | 112014004147 T5 | 7/2016 |
| DE | 102017116434 A1 | 1/2018 |
| DE | 102016115221 A1 | 2/2018 |
| DE | 102016119485 A1 | 4/2018 |
| JP | 2013157346 A | 8/2013 |
| WO | 2012096066 A1 | 7/2012 |

* cited by examiner

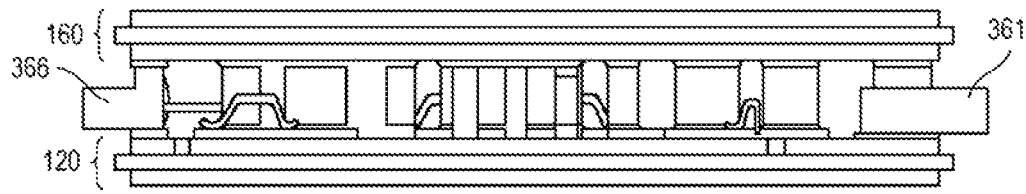

Fig. 3D

```
                    ┌──────────────────────────────────────────┐
                    │ Providing a lower carrier substrate       │
                    │ having an upper electrically conductive   │
                    │ layer, a lower electrically conductive    │
                    │ layer and an electrical insulation layer  │
                    │ arranged between the upper and lower      │
                    │ electrically conductive layers, wherein   │── 401
                    │ an outer region of the upper conductive   │
                    │ layer of the lower carrier substrate is   │
                    │ configured for applying a positive supply │
                    │ voltage, and an inner region of the       │
                    │ upper electrically conductive layer, said │
                    │ inner region being surrounded by the      │
                    │ outer region, is configured as a phase    │
                    └──────────────────────────────────────────┘
                                       │
                                       ▼
                    ┌──────────────────────────────────────────┐
                    │ Applying a first electrically conductive  │
                    │ spacer to the upper electrically          │── 402
                    │ conductive layer of the lower carrier     │
                    │ substrate                                  │
                    └──────────────────────────────────────────┘
                                       │
                                       ▼
                    ┌──────────────────────────────────────────┐
                    │ Applying at least one power semiconductor │
                    │ chip to the upper electrically conductive │── 403
                    │ layer of the lower carrier substrate      │
                    └──────────────────────────────────────────┘
                                       │
                                       ▼
                    ┌──────────────────────────────────────────┐
                    │ Applying a second electrically conductive │── 404
                    │ spacer to the power semiconductor chip    │
                    └──────────────────────────────────────────┘
                                       │
                                       ▼
                    ┌──────────────────────────────────────────┐
                    │ Applying an upper electrically conductive │
                    │ element on the spacers opposite the lower │
                    │ carrier substrate in such a way that a    │── 405
                    │ first region of the upper electrically    │
                    │ conductive element at least partly        │
                    │ overlaps the outer region, wherein the    │
                    │ first region is configured for applying a │
                    │ negative supply voltage                    │
                    └──────────────────────────────────────────┘
```

Fig. 4

DOUBLE-SIDED COOLABLE SEMICONDUCTOR PACKAGE

TECHNICAL FIELD

The present invention relates to a semiconductor package having a double-sided cooling structure, wherein electrically conductive regions in the semiconductor package partly overlap. The present disclosure furthermore relates to a method for producing a semiconductor package having a double-sided cooling structure.

BACKGROUND

The constantly increasing requirements made of the performance of electrical circuits for high currents, e.g. in electrical drives for motor vehicles, require further development and improvement of semiconductor packages which are used in such circuits. Such circuits can have inverters, for example, which convert a battery voltage into an AC voltage for the drive of an electric motor. Such an inverter can be realized by a suitable circuit in a semiconductor package, wherein, with regard to the performance of the inverter, it is crucial to achieve sufficient cooling, the lowest possible impedance, the lowest possible leakage inductances, etc. in the semiconductor package. The performance of such inverters can be increased further by means of improved semiconductor packages and/or by means of improved methods for producing such semiconductor packages.

The problem addressed by the invention is solved by the features of the independent patent claims. Advantageous embodiments and developments of the invention are specified in the dependent claims.

SUMMARY

Individual examples relate to a semiconductor package having a double-sided cooling structure. In an embodiment, the semiconductor package comprises an upper electrically conductive element having an outwardly exposed metal surface, a lower carrier substrate having an upper electrically conductive layer, a lower electrically conductive layer having an outwardly exposed surface, and an electrical insulation layer arranged between the upper and lower electrically conductive layers, a first electrically conductive spacer arranged between the upper electrically conductive element and the upper electrically conductive layer, at least one power semiconductor chip arranged between the upper electrically conductive element and the upper electrically conductive layer, and a second electrically conductive spacer arranged between the upper electrically conductive element and the power semiconductor chip, wherein a first carrier region of the upper electrically conductive layer of the lower carrier substrate is configured for applying a positive supply voltage, a second carrier region of the upper electrically conductive layer, said second carrier region being arranged alongside the first carrier region, is configured as a phase, and a first region of the upper electrically conductive element is configured for applying a negative supply voltage, wherein the first region at least partly overlaps the first carrier region.

In another embodiment, the double-sided semiconductor package comprises an encapsulant body of electrically insulating mold compound; an upper electrically conductive element having an outwardly exposed metal surface that is exposed from a first side of the encapsulant body; a lower carrier substrate having an upper electrically conductive layer, a lower electrically conductive layer having an outwardly exposed surface that is exposed from a second side of the encapsulant body that is opposite from the first side, and an electrical insulation layer arranged between the upper and lower electrically conductive layers; a first electrically conductive spacer arranged between the upper electrically conductive element and the upper electrically conductive layer; a power semiconductor chip arranged between the upper electrically conductive element and the upper electrically conductive layer; and a second electrically conductive spacer arranged between the upper electrically conductive element and the power semiconductor chip, wherein a first carrier region of the upper electrically conductive layer of the lower carrier substrate is electrically connected to a first power terminal of the double-sided coolable semiconductor package, wherein a second carrier region of the upper electrically conductive layer of the lower carrier substrate is arranged alongside the first carrier region is electrically connected to a phase terminal of the double-sided coolable semiconductor package, wherein a first region of the upper electrically conductive element is connected to a second power terminal of the double-sided coolable semiconductor package.

In another embodiment, the double-sided semiconductor package comprises an upper electrically conductive element having an outwardly exposed metal surface; a lower carrier substrate having an upper electrically conductive layer, a lower electrically conductive layer having an outwardly exposed surface, and an electrical insulation layer arranged between the upper and lower electrically conductive layers; a first electrically conductive spacer arranged between the upper electrically conductive element and the upper electrically conductive layer; first and second power semiconductor chips arranged between the upper electrically conductive element and the upper electrically conductive layer; and a second electrically conductive spacer arranged between the upper electrically conductive element and the power semiconductor chip, wherein the first and second semiconductor chips are arranged in a half-bridge circuit such that the first semiconductor chip is a high-side power semiconductor chip of the half-bridge circuit and such that the second semiconductor chip is a low-side power semiconductor chip of the half-bridge circuit, wherein a first carrier region of the upper electrically conductive layer of the lower carrier substrate is configured to apply a first supply voltage to the first semiconductor chip, wherein a second carrier region of the upper electrically conductive layer of the lower carrier substrate is arranged alongside the first carrier region and is configured as a phase node of the half-bridge circuit, wherein a first region of the upper electrically conductive element is configured to apply a second supply voltage to the second semiconductor chip.

In another embodiment the semiconductor package comprising an upper electrically conductive element having an outwardly exposed metal surface, a lower carrier substrate having an inner electrically conductive layer, an outer electrically conductive layer having an outwardly exposed surface, and an electrical insulation layer arranged between the inner and outer electrically conductive layers, a first electrically conductive spacer arranged between the upper electrically conductive element and the upper electrically conductive layer, at least one power semiconductor chip arranged between the upper electrically conductive element and the inner electrically conductive layer, a second electrically conductive spacer arranged between the upper electrically conductive element and the power semiconductor chip, a first power terminal arranged at the lower carrier substrate, and a third power terminal arranged at the upper electrically conductive element, wherein the first power terminal and the third power terminal at least partly overlap.

Individual examples relate to a method for producing a semiconductor package having a double-sided cooling structure. In an embodiment, the method comprises providing a lower carrier substrate having an upper electrically conductive layer, a lower electrically conductive layer and an electrical insulation layer arranged between the upper and lower electrically conductive layers, wherein a first carrier region of the upper electrically conductive layer of the lower carrier substrate is configured for applying a positive supply voltage, and a second carrier region of the upper electrically conductive layer, said second carrier region being arranged alongside the first carrier region, is configured as a phase, applying a first electrically conductive spacer to the upper electrically conductive layer of the lower carrier substrate, applying at least one power semiconductor chip to the upper electrically conductive layer of the lower carrier substrate, applying a second electrically conductive spacer to the power semiconductor chip, and applying an upper electrically conductive element on the spacers opposite the lower carrier substrate in such a way that a first region of the upper electrically conductive element at least partly overlaps the first carrier region, wherein the first region is configured for applying a negative supply voltage.

BRIEF DESCRIPTION OF THE DRAWINGS

The accompanying drawings illustrate examples and together with the description serve to explain the principles of the disclosure. The elements in the drawings are not necessarily true to scale with respect to one another. Identical reference signs may designate mutually corresponding, similar or identical parts.

FIG. 3D illustrates a side view of the semiconductor package.

FIG. 4 shows a flow diagram of a method for producing a semiconductor package.

DETAILED DESCRIPTION

In the present description, the expressions "coupled", "electrically coupled" and/or "electrically connected" are not intended to mean that the elements must be directly coupled; intervening elements can be provided between the "coupled" or "electrically coupled" elements, e.g. solder layers.

Figure 1A:
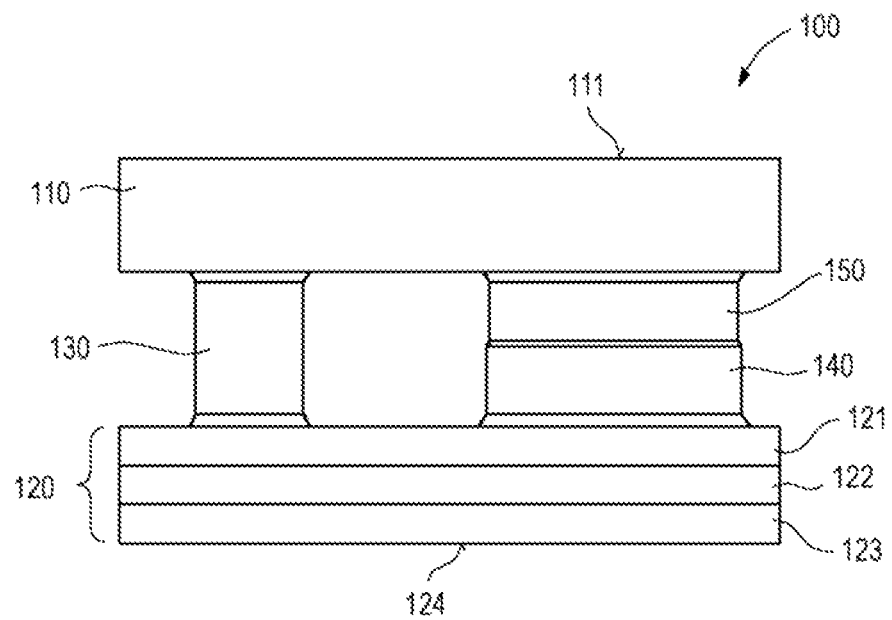
FIG. 1A illustrates a side view of a semiconductor package having a double-sided cooling structure.

FIG. 1A shows a semiconductor package 100 having a double-sided cooling structure in accordance with the disclosure. In this case, "double-sided cooling structure" means that the semiconductor package 100 has an upper electrically conductive element 110 and a lower carrier substrate 120, which can each act as a cooling structure of the semiconductor package 100. The semiconductor package 100 furthermore has a first electrically conductive spacer 130, at least one power semiconductor chip 140 and a second electrically conductive spacer 150. The second electrically conductive spacer 150 is arranged between the upper electrically conductive element 110 and the power semiconductor chip 140.

The lower carrier substrate 120 has an upper electrically conductive layer 121, a lower electrically conductive layer 123 and an electrical insulation layer 122 arranged between the upper 121 and lower 123 conductive layer. The lower carrier substrate 120 can be e.g. a substrate of the DCB (direct copper bond), DAB (direct aluminum bond), or AMB (active metal brazing) type.

In accordance with one example, the semiconductor package 100 can furthermore have an encapsulation body (not shown), which encapsulates the spacers 130, 150, the at least one power semiconductor chip 140, the upper electrically conductive element 110 and the lower carrier substrate 120. In particular, an interspace between the upper electrically conductive element 110 and the lower carrier substrate 120 can be wholly or partly filled by the encapsulation body. However, a metal surface 111 of the upper electrically conductive element 110 and a surface 124 of the lower electrically conductive layer 123 are embodied at all events such that they are wholly or at least partly outwardly exposed (that is to say that the surfaces 111, 124 constitute outer surfaces of the semiconductor package 100).

In accordance with one example, the encapsulation body can comprise or consist of a potting compound or molding compound. The encapsulation body can be produced e.g. by means of compression molding. In order to produce the encapsulation body, e.g. the as yet unencapsulated semiconductor package 100 can be placed into a molding tool, a dielectric compound can be injected, and the dielectric compound can be cured to form the encapsulation body.

The electrically conductive spacers 130, 150 can consist of a metal or a metal alloy and can comprise or consist of e.g. Al or Cu. The first electrically conductive spacer 130 is physically and electrically connected to the upper electrically conductive element 110 and the lower carrier substrate 120, e.g. by means of solder connections or by means of electrically conductive adhesive.

In accordance with one example, the at least one power semiconductor chip 140 comprises or consists of SiC. In accordance with one example, the at least one power semiconductor chip 140 is a chip of the IGBT (insulated-gate bipolar transistor) type. In accordance with one example, a half-bridge circuit is realized in the semiconductor package 100. The half-bridge circuit can have a power terminal for a positive supply voltage ($V_{DD}$), a power terminal for a negative supply voltage ($V_{SS}$) and a power terminal configured as a phase.

The second electrically conductive spacer 150 can be electrically connected to an electrode (not shown) of the power semiconductor chip 140 and to the upper electrically conductive element 110, e.g. by means of solder connections or by means of electrically conductive adhesive. The electrode can be a power electrode or a control electrode of the power semiconductor chip 140. The second electrically conductive spacer 150 can wholly or partly cover the power semiconductor chip 140.

In accordance with one example, the semiconductor package can have external terminals in the form of terminal fingers. At least one portion of said external terminals can be designed to electrically connect electrodes of the at least one power semiconductor chip 140 to the outside world. The external terminals can be electrically connected to the upper electrically conductive element 110 and/or to the upper electrically conductive layer 121. The terminal fingers can be parts of a leadframe. Individual terminals from among the external terminals can be power terminals, which can be electrically connected e.g. to respective power electrodes of the at least one power semiconductor chip 140. One or a plurality of the external terminals can be control terminals, which are electrically connected to a control electrode (e.g. a gate electrode) of the at least one power semiconductor chip 140. Individual terminals from among the external terminals can be measurement terminals, which are designed e.g. to measure $V_{DD}$, $V_{SS}$, the voltage of the phase, a current flow or a temperature in the semiconductor package 100.

In the semiconductor package 100, a first carrier region of the upper electrically conductive layer 121 is configured for applying the positive supply voltage, a second carrier region of the upper electrically conductive layer 121, said second carrier region being arranged alongside the first carrier region, is configured as a phase, and a first region of the upper electrically conductive element 110 is configured for applying the negative supply voltage, wherein the first region at least partly overlaps the first carrier region. The semiconductor package 100 can be embodied in such a way that the degree of overlap of the first region and the first carrier region is as high as possible. The first region can overlap e.g. at least 20%, at least 30%, at least 40% or more of the first carrier region.

An overlap of the first region (at which e.g. $V_{SS}$ is present) over the first carrier region (at which e.g. $V_{DD}$ is present) can contribute to reducing the inductance of the semiconductor package 100. The inductance can be reduced because $V_{SS}$ and $V_{DD}$ are close to one another as a result of the overlap. This reduction of the inductance may be desired, for example, if the at least one power semiconductor chip 140 is a SiC-based power semiconductor chip, since SiC-based power semiconductor chips have a lower tolerance than IGBTs vis à vis disturbing inductances.

Figure 1B:
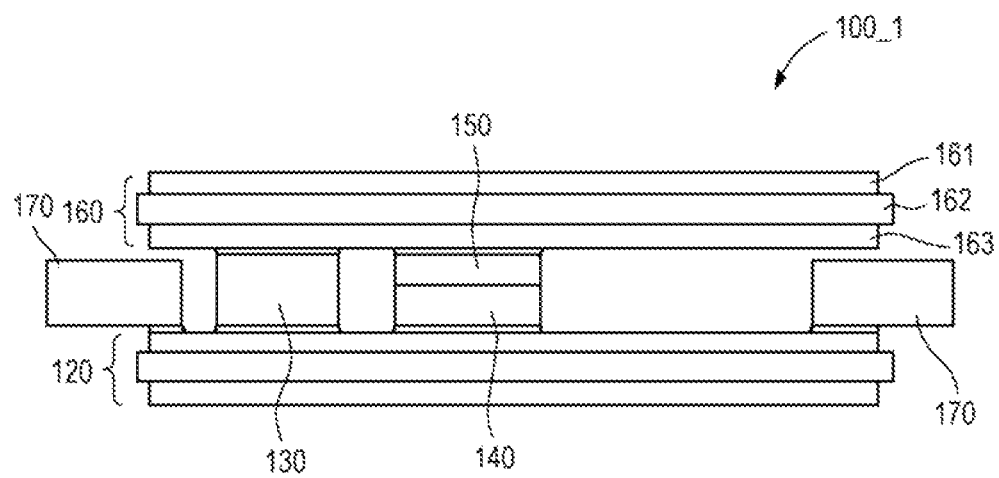
FIG. 1B illustrates a side view of a further semiconductor package having a double-sided cooling structure.

FIG. 1B shows a semiconductor package 100_1, which can correspond to the semiconductor package 100 from FIG. 1A apart from the differences described below. In the case of the semiconductor package 100_1, the upper electrically conductive element 110 has an upper carrier substrate 160 having an upper electrically conductive layer 161, a lower electrically conductive layer 163 and an electrical insulation layer 162 arranged between the upper 161 and lower 163 electrically conductive layer. In this case, the upper electrically conductive layer 161 corresponds to the outwardly exposed metal surface 111.

The semiconductor package 100_1 can furthermore have external terminals 170, which, as shown in FIG. 1B, are arranged between the upper carrier substrate 160 and the lower carrier substrate 120. In accordance with one example, each individual one of the external terminals 170 can be electrically connected to the lower electrically conductive layer 163 of the upper carrier substrate 160 or to the upper electrically conductive layer 121 of the lower carrier substrate 120.

The lower electrically conductive layer 163 of the upper carrier substrate 160 and the upper electrically conductive layer 121 of the lower carrier substrate 120 are structured and can have e.g. chip islands, conduction tracks and/or application locations for the electrically conductive spacers 130, 150.

Figure 2:
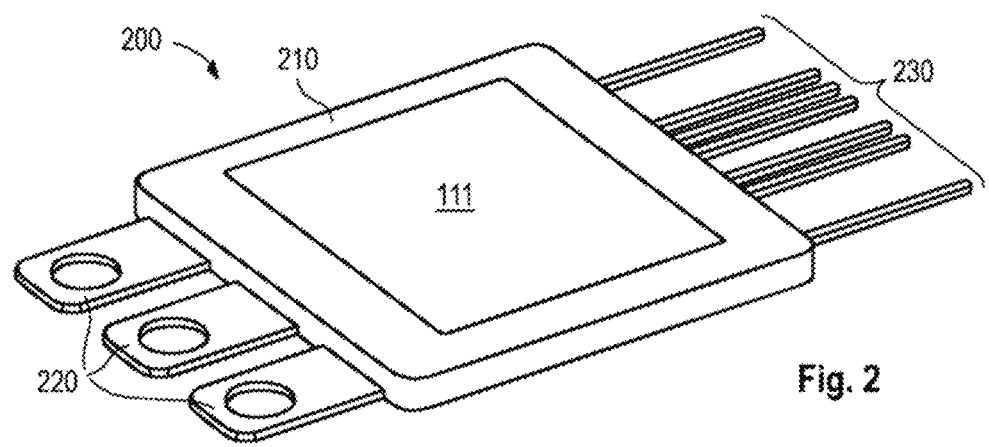
FIG. 2 shows a perspective view of a semiconductor package having a double-sided cooling structure, which furthermore comprises an encapsulation body.

FIG. 2 shows a perspective view of a semiconductor package 200, which can be identical to the semiconductor packages 100 and 100_1. The semiconductor package 200 has an encapsulation body 210, which encapsulates the spacers 130, 150, the upper electrically conductive element 110, the lower carrier substrate 120 and the at least one power semiconductor chip 140. The surfaces 111 and the surface 124 (not visible in FIG. 2) are exposed at the encapsulation body 210 at opposite sides of the semiconductor package 200.

The encapsulation body 210 consists of a suitable electrically insulating material or comprises such a material, e.g. a plastic, a polymer or a resin. The encapsulation body 210 can be e.g. a molded body.

The surface 111 and/or the surface 124 can have an electrically insulating coating and can be configured in each case for the application of a heat sink.

The semiconductor package 200 has external terminals 220, 230 arranged at side surfaces of the semiconductor package 200 which connect the opposite sides to the metal surface 111 and the surface 124. The external terminals 220 can be designed as power terminals and the external terminals 230 can be designed as control terminals or measurement terminals. In accordance with one example, the power terminals are arranged only at one side of the semiconductor package and the control and/or measurement terminals are arranged only at an opposite side. In accordance with another example, a power terminal configured as a phase is arranged at the side having the control or measurement terminals. The external terminals 220 and 230 can be parts of a common leadframe.

Figure 3A:
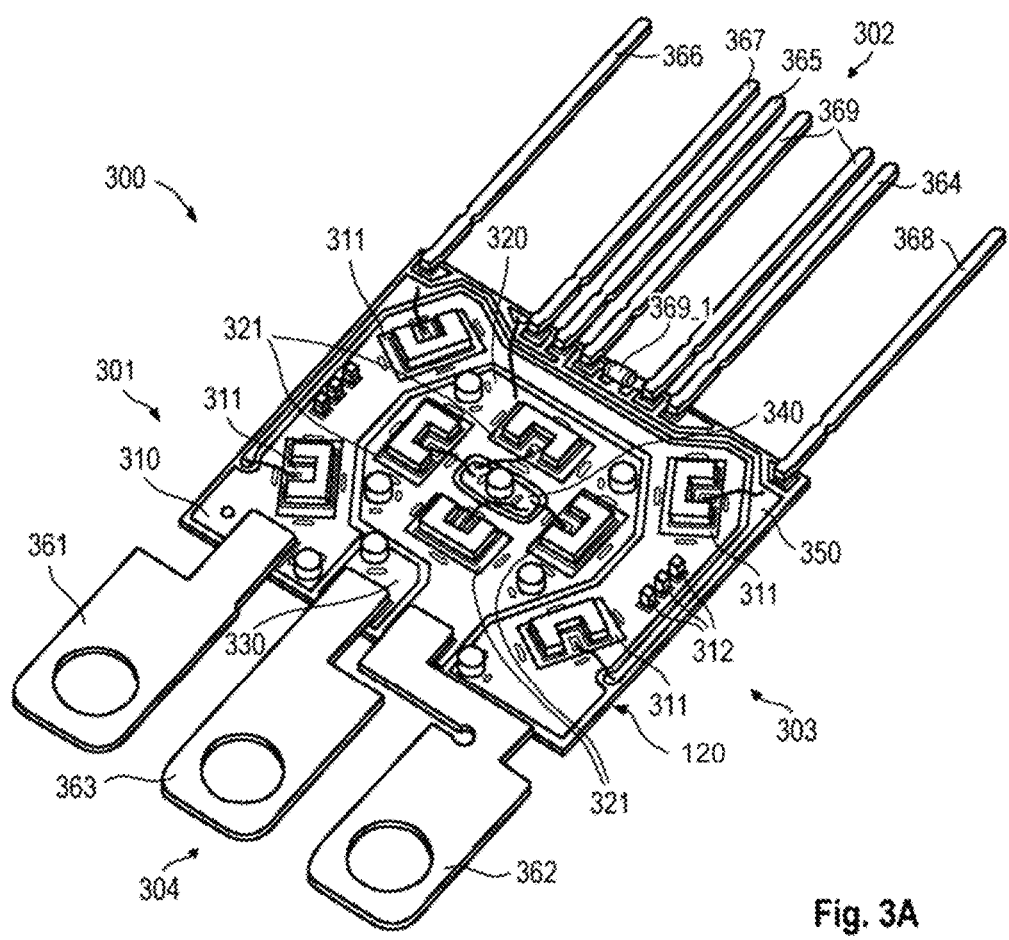
FIG. 3A illustrates a perspective view of a lower carrier substrate of a further semiconductor package.

FIG. 3A shows a perspective view of a lower carrier substrate 120 of a semiconductor package 300. The semiconductor package 300 can be identical to the semiconductor packages 100, 100_1 and 200. In the perspective view in FIG. 3A, the first carrier region 310 and the second carrier region 320 of the upper electrically conductive layer 121 are discernible. The upper electrically conductive layer 121 is interrupted between the regions 310 and 320.

In accordance with one example, a surface area of the first carrier region 310 and a surface area of the second carrier region 320 can be equal in magnitude or approximately equal in magnitude. A difference between the two surface areas can be e.g. approximately 10%, 20%, 30%, 40%, 50%, or 60%.

The first carrier region 310 can be arranged alongside the second carrier region 320. The first carrier region 310 can in particular completely surround the second carrier region 320 at three sides 301, 302, 303 of the lower carrier substrate 120. At a fourth side 304 of the lower carrier substrate, which side corresponds to an open side of the first carrier region 310, the first carrier region 310 and the second carrier region 320 can extend as far as or almost as far as an outer edge of the lower carrier substrate 120.

In accordance with one example, the first carrier region 310 can be embodied in a U-shaped fashion. The closed sides of the U can be arranged along the first, second and third sides 301, 302 and 303 and the open side of the U can be arranged at the fourth side 304. The second carrier region 320 can be completely surrounded by the U along the sides 301, 302 and 303.

At the fourth side 304, the first carrier region 310 can be electrically connected to a first power terminal 361 designed for applying $V_{DD}$. At the fourth side 304, the second carrier region 320 can be electrically connected to a second power terminal 362 designed as a phase terminal of the half-bridge circuit.

At the second side 302, the first carrier region 310 can be electrically connected to a first measurement terminal 366 designed for measuring $V_{DD}$. At the second side 302, the second carrier region 320 can be electrically connected to a second measurement terminal 367 designed for measuring the phase.

Alongside the first carrier region 310 and the second carrier region 320, one or a plurality of further regions can be formed in the upper electrically conductive layer 121 of the lower carrier substrate 120. By way of example, a further (carrier) region 330 and/or a further (carrier) region 340 and/or a further (carrier) region 350 can be formed.

The region 330 can be arranged at the fourth side 304 and it can be arranged alongside the second carrier region 320 in the opening of the first carrier region 310. The region 330 can be electrically connected to the upper carrier substrate 160, e.g. by means of an electrically conductive spacer such as the spacer 130 arranged on the region 330. At the fourth side 304, the region 330 can be electrically connected to a third power terminal 363 designed for applying $V_{SS}$. At the second side 302, the region 330 can be electrically connected to a third measurement terminal 368 designed for measuring $V_{SS}$.

The region 340 can be arranged within the second carrier region 320 and can be completely surrounded toward all four sides by the second carrier region 320. The region 340 can be electrically connected to the upper carrier substrate 160, e.g. by means of an electrically conductive spacer such as the spacer 130. The region 340 can be electrically connected to a first control terminal 364 of the half-bridge circuit, said control terminal being arranged at the second side 302.

The region 350 can be arranged outside the first carrier region 310 and it can be arranged e.g. along the sides 301, 302 and 303 and at least partly surround the first carrier region 310 at said sides. In accordance with one example, the region 350 has no electrical connection to the upper carrier substrate 160. The region 350 can comprise a signal line and it can be electrically connected to a second control terminal 365 of the half-bridge circuit, said second control terminal being arranged at the second side 302.

The semiconductor package 300 has at least one power semiconductor chip. By way of example, the semiconductor package 300 has first power semiconductor chips 311, which are arranged on the first carrier region 310 and are electrically connected thereto, and second power semiconductor chips 321, which are arranged on the second carrier region 320 and are electrically connected thereto. In accordance with one example, the semiconductor package 300 has four first power semiconductor chips 311 and four second power semiconductor chips 321. The first power semiconductor chips 311 can be embodied as high-side power semiconductor chips of the half-bridge circuit and the second power semiconductor chips 321 can be embodied as low-side power semiconductor chips of the half-bridge circuit of the semiconductor package 300.

The first and second power semiconductor chips 311 and 321 have on their underside in each case a power electrode, e.g. a drain electrode, which is electrically coupled to the first carrier region 310 and to the second carrier region 320, respectively. The first and second power semiconductor chips 311 and 321 have on their top side in each case a power electrode, e.g. a source electrode, which is electrically coupled to the upper carrier substrate 160 by means of an electrically conductive spacer 150 arranged on the top side of the respective power semiconductor chip 311, 321. The power semiconductor chips 311, 321 furthermore have on their top side in each case a control electrode, e.g. a gate electrode. The control electrodes of the first power semiconductor chips 311 are electrically connected to the region 350, e.g. by means of bond wires. The control electrodes of the second power semiconductor chips 321 are electrically connected to the region 340, e.g. by means of bond wires.

In accordance with one example, the semiconductor package 300 can furthermore have passive elements arranged on the lower carrier substrate 120, e.g. one or a plurality of buffer capacitors 312 and/or a resistor 369_1. The buffer capacitor(s) can be arranged on the first carrier region 310 and can be electrically connected thereto. The buffer capacitor(s) 312 can be designed for buffering a voltage profile in the half-bridge circuit. The resistor 369_1 can be an NTC (negative thermal coefficient) thermistor and it can be electrically connected to fourth measurement terminals 369. The resistor 369_1 and the fourth measurement terminals 369 can be designed for measuring a temperature in the semiconductor package 300.

Figure 3B:
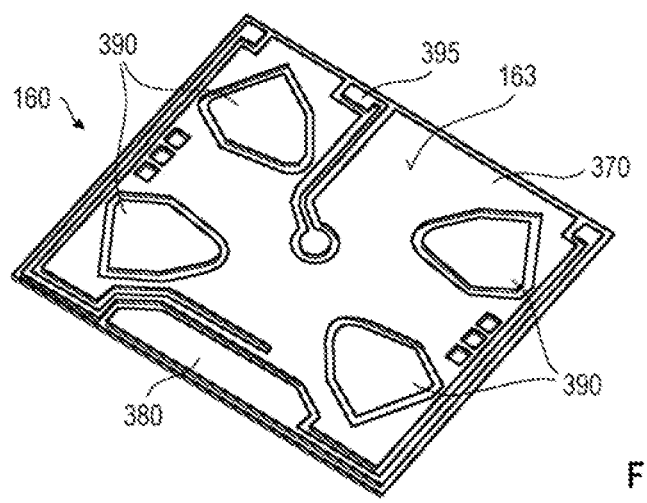
FIG. 3B illustrates the upper cooling structure in perspective view.

FIG. 3B shows a perspective view of an upper carrier substrate 160 of the semiconductor package 300, wherein FIG. 3B shows a perspective view of the underside of the upper carrier substrate 160 (cf. the arrow in FIG. 3D for the viewing direction).

The lower electrically conductive layer 163 of the upper carrier substrate 160 is structured and has a first region 370. The first region 370 at least partly overlaps the first carrier region 310 if the upper carrier substrate 160 is arranged above the lower carrier substrate 120 in the semiconductor package 300. The first region 370 can overlap at least 20%, at least 30%, at least 40% or more of the first carrier region 310.

The first region 370 can be configured for applying $V_{SS}$. The first region 370 can be configured to be electrically connected to the region 330 on the lower carrier substrate 120, e.g. by means of an electrically conductive spacer. The first region 370 can be electrically connected to the second power semiconductor chips 321, e.g. by means of the electrically conductive spacers arranged on the second power semiconductor chips 321.

The lower electrically conductive layer 163 of the upper carrier substrate 160 can have a second region 380, which is electrically connected to the first carrier region 310, e.g. by means of one or a plurality of electrically conductive spacers. The second region 380 can electrically connect two limbs of the first carrier region 310 (those parts of the first carrier region which are arranged along the sides 301 and 303) to one another. The second region 380 can be electrically connected to the first measurement terminal 366. The second region 380 can extend along the first side 301 and at least partly along the fourth side 304.

The lower electrically conductive layer 163 of the upper carrier substrate 160 can have a third region 390, which is electrically connected to the second carrier region 320 of the lower carrier substrate 120. The third region 390 can have a plurality of partial regions spatially separated from one another, e.g. four partial regions as in the example in FIG. 3B. The partial regions can be electrically connected to the second carrier region 320 (and thus also to one another) in each case by means of an electrically conductive spacer. Each of the partial regions can cover a first power semiconductor chip 311 and can be electrically connected thereto by means of the spacer arranged on the respective first power semiconductor chip.

The lower electrically conductive layer 163 can have a fourth region 395, which is electrically connected to a control electrode of the at least one power semiconductor chip of the semiconductor package 300. In accordance with one example, the fourth region 395 is electrically connected to the region 340 of the lower carrier substrate 120. In accordance with one example, the fourth region 395 is electrically connected to the control electrodes of the second power semiconductor chips 321.

Figure 3C:
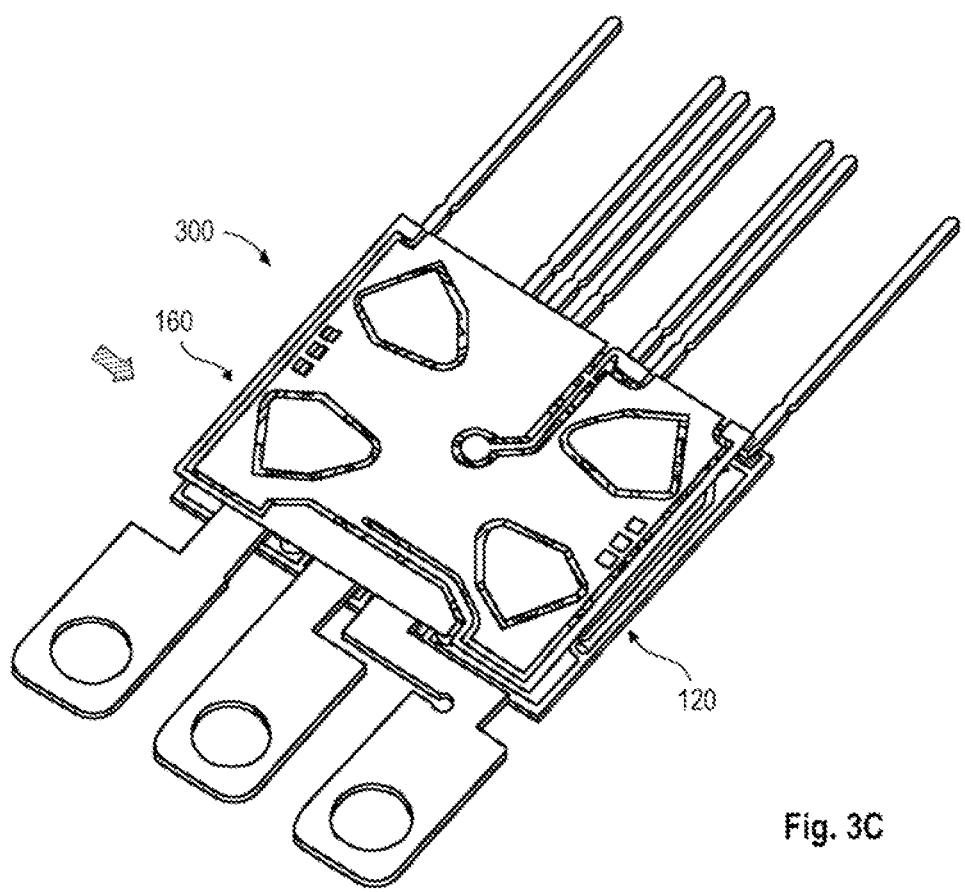
FIG. 3C illustrates the assembled semiconductor package in perspective view.

FIG. 3C shows the semiconductor package 300 after the arrangement of the upper carrier substrate 160 above the lower carrier substrate 120 from FIG. 3A. For the sake of clarity, FIG. 3C shows only the lower conductive layer 163 of the upper carrier substrate 160; the upper electrically conductive layer 161 and the insulation layer 162 have been omitted. It is evident that the first region 370 overlaps the first carrier region 310 at least partly or even for the most part. The basic areas of the upper and lower carrier substrates 120, 160 can be identical or almost identical and the carrier substrates 120, 160 can be arranged congruently or almost congruently one above the other.

In accordance with one example, the semiconductor package 300 has an encapsulation body (cf. FIG. 2), which is not shown in FIG. 3C for reasons of clarity.

FIG. 3D shows a side view of the semiconductor package 300 along the direction of the arrow in FIG. 3C.

FIG. 4 shows a flow diagram of a method 400 for producing a semiconductor package having a double-sided cooling structure. In accordance with the method 400, by way of example, the semiconductor packages 100, 100_1, 200 and 300 can be produced.

The method 400 comprises, at 401, providing a lower carrier substrate having an upper electrically conductive layer, a lower electrically conductive layer and an electrical insulation layer arranged between the upper and lower electrically conductive layers, wherein a first carrier region of the upper electrically conductive layer of the lower carrier substrate is configured for applying a positive supply voltage, and a second carrier region of the upper electrically conductive layer, said second carrier region being arranged alongside the first carrier region, is configured as a phase. The method 400 comprises, at 402, applying a first electrically conductive spacer to the upper electrically conductive layer of the lower carrier substrate. The method 400 comprises, at 403, applying at least one power semiconductor chip to the upper electrically conductive layer of the lower carrier substrate. The method 400 comprises, at 404, applying a second electrically conductive spacer to the power semiconductor chip. The method 400 comprises, at 405, applying an upper electrically conductive element on the spacers opposite the lower carrier substrate in such a way that a first region of the upper electrically conductive element at least partly overlaps the first carrier region, wherein the first region is configured for applying a negative supply voltage.

In accordance with one example, the upper electrically conductive element has an upper carrier substrate having an upper electrically conductive layer, a lower electrically conductive layer and an electrical insulation layer arranged between the upper and lower electrically conductive layers. The method 400 can furthermore comprise electrically connecting a second region of the upper electrically conductive element to two limbs of the first carrier region. The method 400 can furthermore comprise electrically connecting a third region of the upper electrically conductive element to the second carrier region. The method 400 can furthermore comprise encapsulating the spacers, the at least one power semiconductor chip, the upper electrically conductive element and the lower carrier substrate into an encapsulation body. The method 400 can furthermore comprise applying a second power semiconductor chip to the upper electrically conductive layer of the lower carrier substrate, and electrically connecting the power semiconductor chips to form a half-bridge circuit. The method 400 can furthermore comprise etching the upper electrically conductive layer of the lower carrier substrate in order to produce the first carrier region and the second carrier region.

A further example of a semiconductor package 500 is shown below with reference to FIGS. 5A through 5C. The semiconductor package 500 can be similar to the semiconductor packages 100, 100_1, 200 and 300 and have, in comparison therewith, only the differences shown below. The semiconductor package 500 can be produced in accordance with a production method such as the method 400.

Figure 5A:
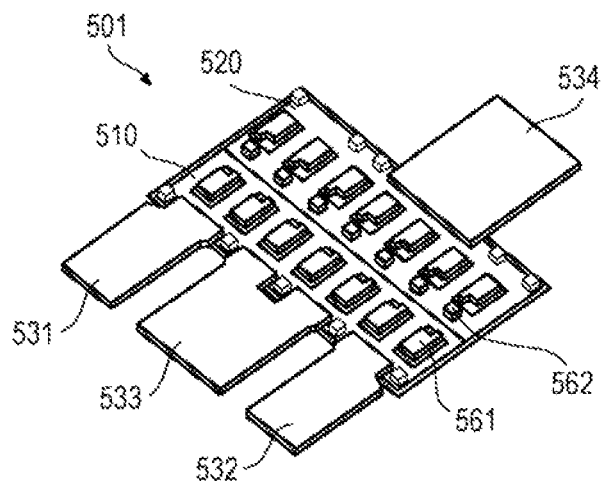
FIGS. 5A to 5C illustrates further examples of a semiconductor package.

FIG. 5A shows a lower carrier substrate 501 of the semiconductor package 500. The lower carrier substrate 501 has a first carrier region 510 with first power semiconductor chips and a second carrier region 520 with second power semiconductor chips, said second carrier region being arranged alongside the first carrier region 510. The first carrier region 510 can be designed e.g. for applying $V_{DD}$ and the second carrier region 520 can be designed e.g. as a phase.

In accordance with one example, a first power terminal 531, a second power terminal 532 and a third power terminal 533 can be arranged at a first side of the lower carrier substrate 501. The first and second power terminals 531, 532 can be electrically connected to the first carrier region 510 and can be designed e.g. as $V_{DD}$ terminals. The third power terminal 533 can be arranged between the first and second power terminals 531, 532 and can be designed to be electrically connected to the first region 540 of the upper carrier substrate 502 (cf. FIG. 5B). The second power terminal can be designed e.g. as a $V_{SS}$ terminal.

In accordance with one example, a fourth power terminal 534 of the semiconductor package 500 can be electrically connected to the second carrier region 520 and can be configured as a phase terminal. The fourth power terminal 534 can be arranged on a second side of the lower carrier substrate 501, said second side being situated opposite the first side.

Figure 5B:
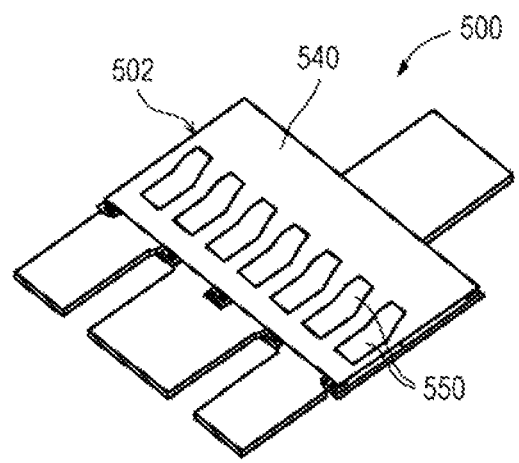
Figure 5C:
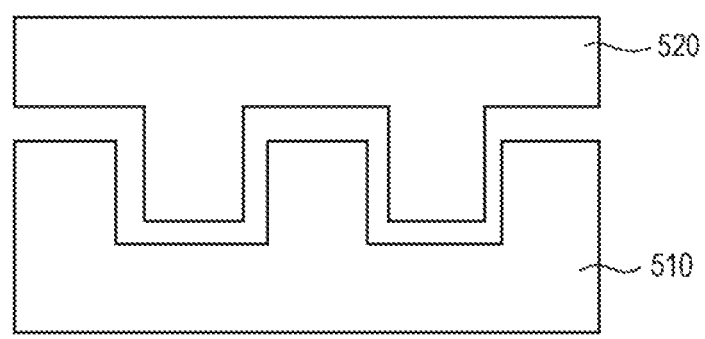

FIG. 5B shows the semiconductor package 500 after the upper carrier substrate 502 has been applied above the lower carrier substrate 501. The upper carrier substrate has the first region 540 and second regions 550. The first region 540 can be configured for applying $V_{SS}$ and the second regions 550 can be configured as a phase. The first region 540 is electrically connected to the third power terminal 533. The second regions 550 are respectively connected to an upper power electrode (e.g. the source electrode) of the first power semiconductor chips via a first electrically conductive spacer 561 and to the second carrier region 520 via a second electrically conductive spacer 562.

As can be discerned in FIG. 5B, the first region 540 of the upper carrier substrate 502 at least partly overlaps the first carrier region 510 of the lower carrier substrate 501.

In accordance with one example, the semiconductor package 500 furthermore has an encapsulation body, which at least partly encapsulates the upper and lower carrier substrates 501, 502. For reasons of clarity, such an encapsulation body is not shown in FIG. 5B. Furthermore, the semiconductor package 500 can have further structured regions on the lower and/or the upper carrier substrate 501, 502, e.g. control lines, and in addition further terminals such as measurement or control terminals. These are likewise not shown for reasons of clarity.

In accordance with one example, the boundary between the first carrier region 510 and the second carrier region 520 does not extend rectilinearly, but rather has a toothing. FIG. 5C shows a plan view of the boundary between the first carrier region 510 and the second carrier region 520 in accordance with one example having such a toothing. Such a course of the carrier regions 510, 520 can contribute to the first carrier region 510 being optimally overlapped by the first region 540 of the upper carrier substrate 502.

A further example of a semiconductor package 600 is shown below with reference to FIGS. 6A and 6B. The semiconductor package 600 can be similar to the semiconductor packages 100, 100_1, 200, 300 and 500 and have, in comparison therewith, only the differences shown below. The semiconductor package 600 can be produced in accordance with a production method such as the method 400.

With regard to the semiconductor packages 200, 300 and 500, it is shown that the power terminals designed for applying $V_{DD}$ and $V_{SS}$, respectively, are arranged laterally alongside one another. However, it is also possible for said power terminals to be arranged one above another, as in the case of the semiconductor package 600.

Figure 6A:
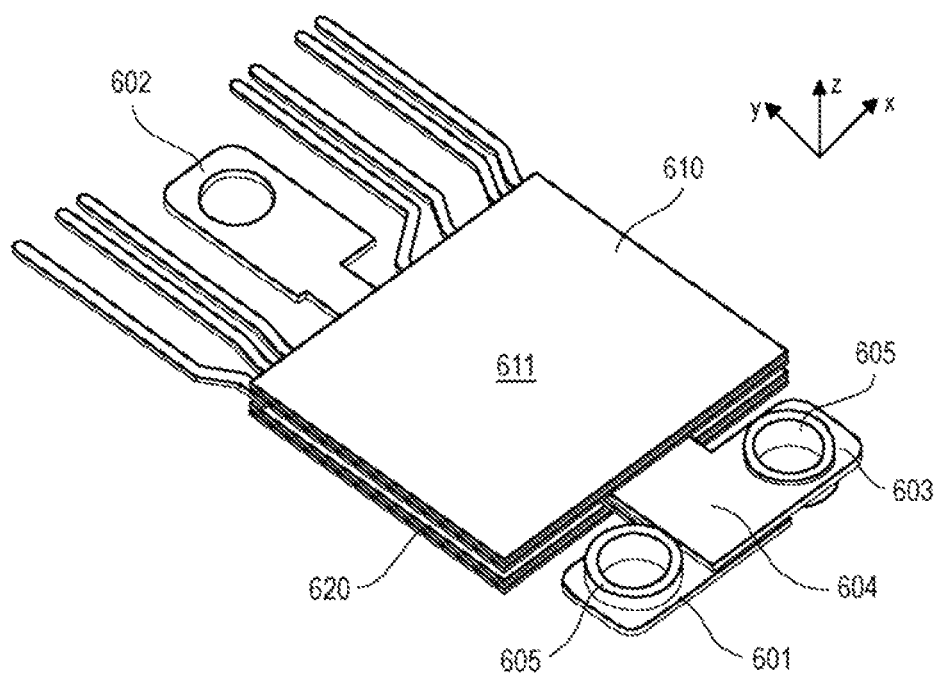
FIGS. 6A and 6B illustrate different views of one example of a semiconductor package having at least partly overlapping power terminals.
Figure 6B:
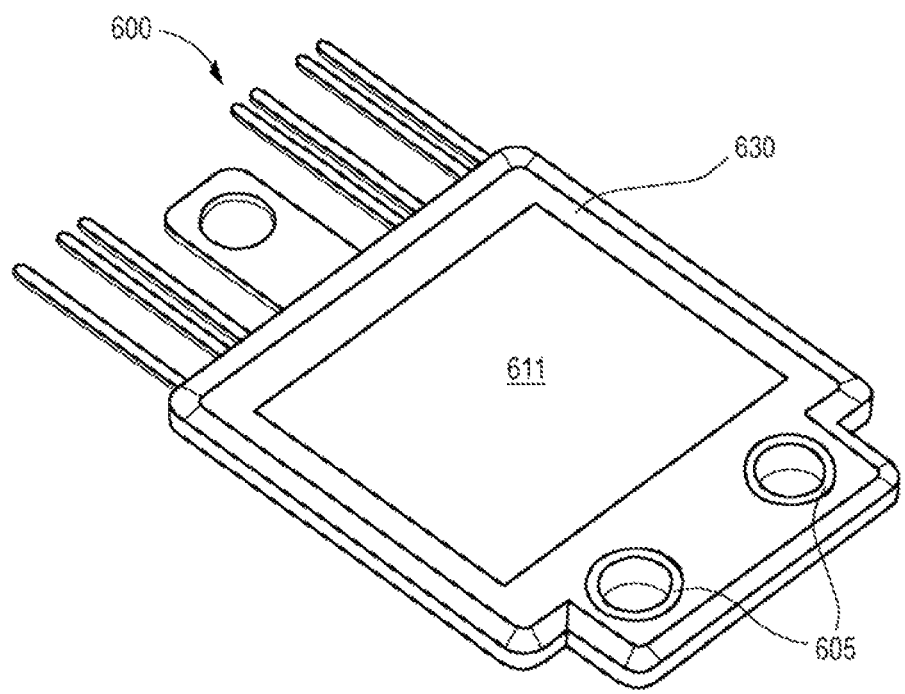

FIG. 6A shows a perspective view of the semiconductor package 600 in a stage of manufacture before an encapsulation body 630 has been produced. The finished semiconductor package 600 is shown in FIG. 6B. The semiconductor package 600 has a first power terminal 601, a second power terminal 602 and a third power terminal 603. In accordance with one example, the first power terminal 601 can be configured for applying $V_{DD}$, the second power terminal 602 can be configured as a phase terminal, and the third power terminal 603 can be designed for applying $V_{SS}$.

In accordance with one example, the first and second power terminals 701, 702 can be parts of the same leadframe. The third power terminal 703 can be e.g. part of a further leadframe. The third power terminal 703 can be arranged by means of "pick and place" fitting above the first power terminal 701.

In accordance with one example, the first and third power terminals 601, 603 can be arranged on a first side of the semiconductor package 600 and the second power terminal 602 can be arranged at an opposite second side.

The first power terminal 601 and the third power terminal 603 are arranged in such a way that they at least partly overlap, e.g. within an overlap region 604. In particular, the overlap region 604 can directly adjoin the edge of an upper conductive element 610 or of a lower carrier substrate 620 of the semiconductor package 600.

The use of overlapping or at least partly overlapping first and third power terminals 601, 603 can contribute to reducing the inductance in the semiconductor package 600. In the case where the semiconductor package 600 also has overlapping $V_{DD}$ and $V_{SS}$ regions of the upper electrically conductive element 610 and of the lower carrier substrate 620, as described e.g. with regard to the semiconductor package 300 in FIGS. 3A through 3D, then the inductance can be reduced to a greater extent than is possible with the semiconductor package 300.

The first and third power terminals 601, 603 can each have an eye 605 arranged in a region of the first and respectively third power terminals 601, 603 which adjoins the overlap region 604. The eyes 605 can project beyond the first and respectively third power terminals 601, 603 along the z-axis in FIG. 6A. In particular, an upper and a lower edge of the eyes 605 can be coplanar with an upper surface 611 of the upper electrically conductive element 610 and, respectively, a lower surface (not visible in FIGS. 6A-6B) of the lower carrier substrate 620. Furthermore, the encapsulation body 630 can be coplanar with the upper surface 611 and the lower surface of the lower carrier substrate 620. At all events the eyes 605 are configured such that they are exposed at the encapsulation body 630. This can be achieved e.g. by virtue of the fact that, during compression molding of the encapsulation body 630, the top sides and undersides of the eyes 605 bear against the walls of the molding tool and thus seal the interior of the eyes 605. The remaining parts of the first and third power terminals 601, 603—in particular the overlap region 604—can be covered by the encapsulation body 630, as shown e.g. in FIG. 6B. In this way, the eyes 605 allow the first and third power terminals 601, 603 to be electrically contacted from outside.

A further example of a semiconductor package 700 is shown below with reference to FIGS. 7A and 7B. The semiconductor package 700 can be similar to the semiconductor package 600 and have, in comparison therewith, only the differences shown below.

Figure 7A:
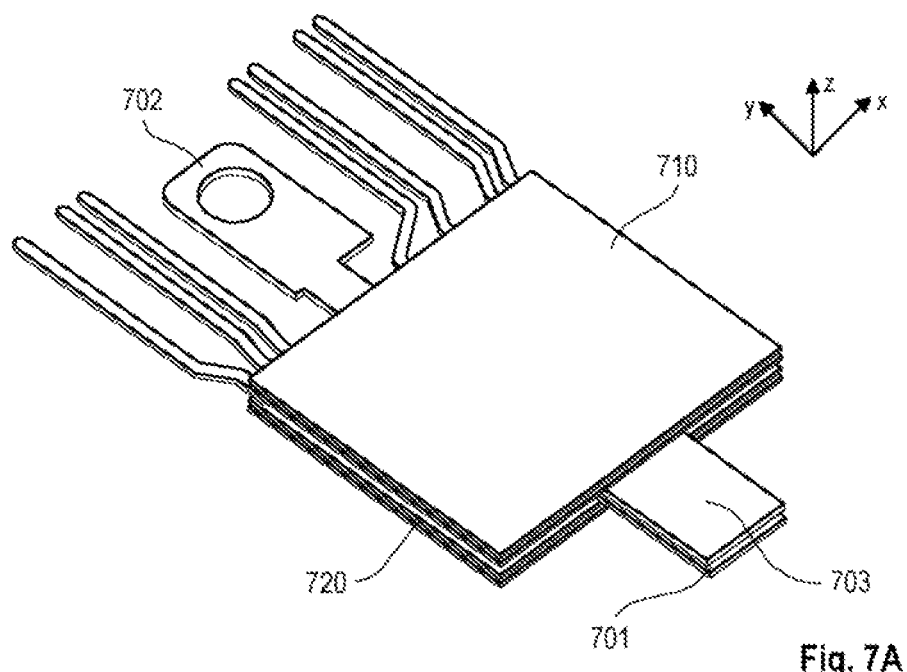
FIGS. 7A and 7B illustrate different views of a further example of a semiconductor package having at least partly overlapping power terminals.
Figure 7B:
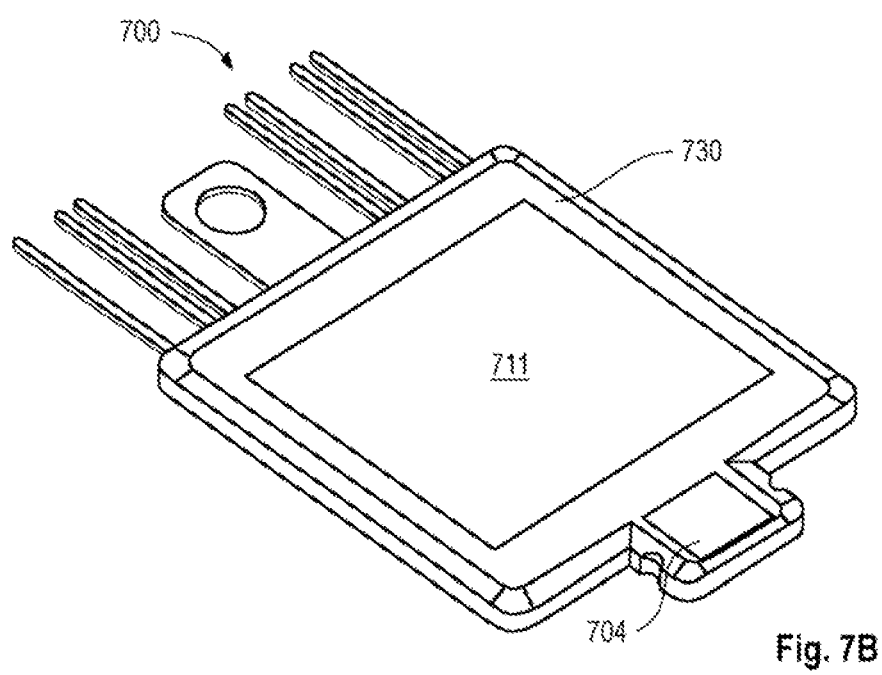

FIG. 7A shows the semiconductor package 700 in perspective view in a stage of manufacture in which an encapsulation body has not yet been manufactured. FIG. 7B shows the finished semiconductor package 700.

The semiconductor package 700 can differ from the semiconductor package 600 exclusively in that a first and third power terminal 701, 703 have no eyes 605. Instead, an upper surface 704 of the third power terminal 703 and a lower surface (not shown in FIGS. 7A-7B) of the first power terminal 701 are exposed at the encapsulation body 730.

In accordance with one example, the upper surface 704 of the third power terminal 703 is coplanar with an upper surface 711 of an upper electrically conductive element 710 and/or an upper surface of the encapsulation body 730, and the lower surface of the first power terminal 701 is coplanar with a lower surface of a lower carrier substrate 720 and/or a lower surface of the encapsulation body 730. This can be achieved e.g. by virtue of the power terminals 701, 703 having a stepped portion along the z-axis in FIGS. 7A-7B.

In accordance with another example, the upper surface 704 of the third power terminal 703 and the lower surface of the first power terminal 701 can be arranged in a different plane than the upper surface 711 of the upper electrically conductive element 710 and, respectively, the lower surface of the lower carrier substrate 720.

It is also possible that the upper surface 704 of the third power terminal 703 and the lower surface of the first power terminal 701 are initially concomitantly encapsulated during the production of the encapsulation body 730 (e.g. by compression molding) and they are subsequently freed of the encapsulation body 730, e.g. by means of milling. In accordance with another example, during the compression molding a film can be used to cover the upper surface 704 of the third power terminal 703 and the lower surface of the first power terminal 701.

Figure 8A:
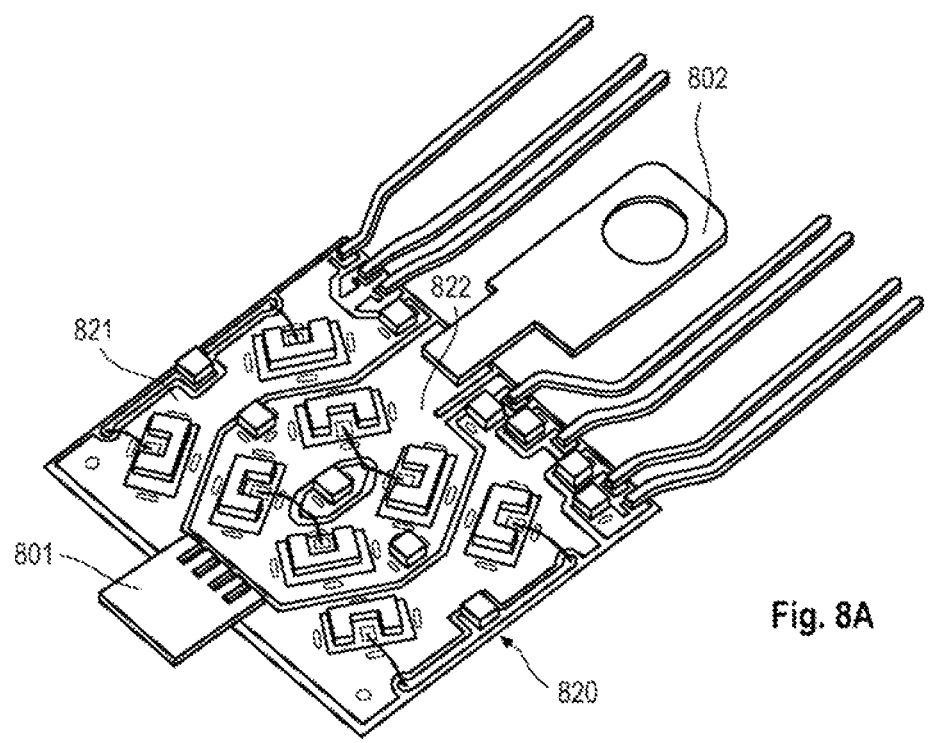
FIGS. 8A and 8B illustrate a lower carrier substrate and an upper electrically conductive element such as can be used in the semiconductor packages in FIGS. 6A-6B and 7A-7B.

FIG. 8A shows a perspective view of a lower carrier substrate 820. The lower carrier substrate can be identical to the lower carrier substrates 120, 620 and 720. The lower carrier substrate has a first carrier region 821 and a second carrier region 822.

The first carrier region 821 can be designed for applying $V_{DD}$ and the second carrier region 822 can be designed as a phase, in a manner analogous to that as described further above with regard to the lower carrier substrate 120 in FIG. 3A. The first carrier region 821 is electrically connected to a first power terminal 801. The second carrier region 822 is electrically connected to a second power terminal 802.

Figure 8B:
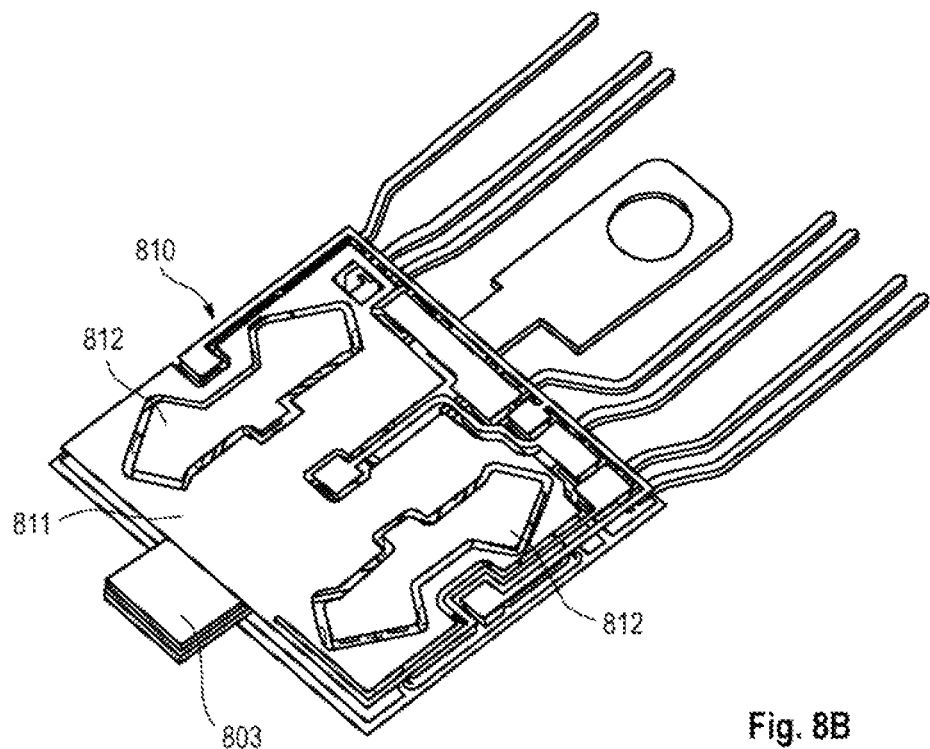

In FIG. 8B, an upper electrically conductive element 810 is arranged above the lower carrier substrate 820. The upper electrically conductive element 810 can be substantially identical to the upper electrically conductive element 110 and to the upper carrier substrate 160.

The upper electrically conductive element 810 has a first region 811 and second regions 812. The first region 811 can be configured for applying $V_{SS}$ and can be electrically connected to a third power terminal 803. The second region 812 can be configured as a phase.

With regard to the electrical contacts between the carrier regions 821, 822 and the regions 811, 812, reference should be made to the explanations concerning the semiconductor package 300 further above.

The first power terminal 801 and the third power terminal 803 are arranged in a manner overlapping one another, as described with regard to the semiconductor packages 600 and 700.

The overlapping first and third power terminals of the semiconductor packages 600, 700 and 800 can be arranged in each case on an inner metal surface (e.g. the conductive layer 121 and 163, respectively, cf. FIG. 1) of the upper electrically conductive element 610, 710, 810 and of the lower carrier substrate 620, 720, 820, respectively. Alternatively, however, the first and third power terminals 601, 603, 701, 703, 801, 803 can also be arranged on an electrical insulation layer (e.g. the insulation layer 122 and 162, respectively, cf. FIG. 1) of the upper electrically conductive element 610, 710, 810 and of the lower carrier substrate 620, 720, 820, respectively, and can laterally adjoin the respective inner metal surface, as shown in FIGS. 9A and 9B.

Figure 9A:
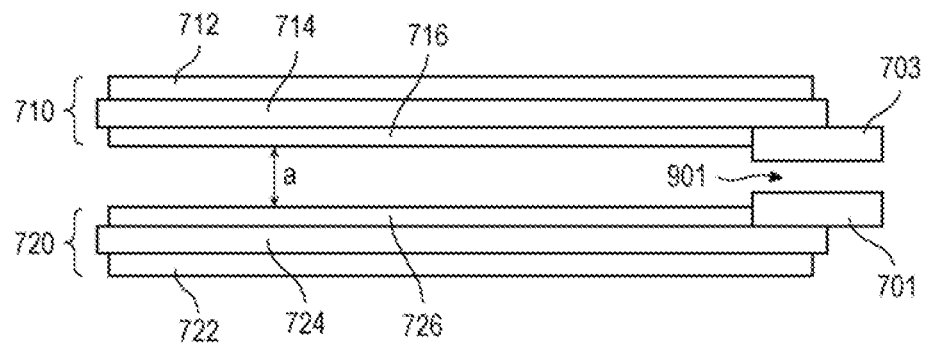
FIG. 9A illustrates a side view of a detail from FIGS. 7A-7B.
Figure 9B:
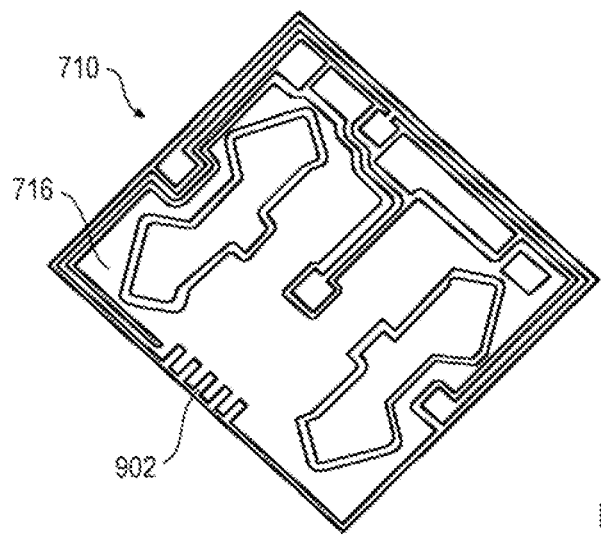
FIG. 9B illustrates a perspective view of an upper electrically conductive element.

FIG. 9A shows an enlarged side view of the first and third power terminals 701, 703 and of parts of the lower carrier substrate 720 and of the upper electrically conductive element 710 of the semiconductor package 700 along the x-axis from FIG. 7A.

As illustrated in FIG. 9A, the upper electrically conductive element 710 can have an inner electrically conductive layer 716, an electrical insulation layer 714 and an outer electrically conductive layer 712. The lower carrier substrate 720 can have an inner electrically conductive layer 726, an electrical insulation layer 724 and an outer electrically conductive layer 722. The first and third power terminals 701, 703 can be arranged in each case directly on the electrical insulation layer 714 of the upper electrically conductive element 710 and directly on the electrical insulation layer 724 of the lower carrier substrate, respectively. The first power terminal 701 can be directly connected to a sidewall of the inner conductive layer 726, and the third power terminal 703 can be directly connected to a sidewall of the inner conductive layer 716.

By applying the power terminals 701, 703 directly on the upper electrically conductive element 710 and the lower carrier substrate 720, respectively, as illustrated in FIG. 9A, it is possible to dispense with the use of electrical interconnections such as bond wires or bond tapes, for instance, in order to connect the power terminals 701, 703 to the respective inner conductive layer 716, 726. Rather, the power terminals 701, 703 can be electrically connected to the respective inner conductive layer 726, 716, by means of a solder connection, a sintering connection, a welding connection, a plug connection or any other direct connection.

By arranging the overlapping power terminals 701, 703 on the insulation layers 714, 724 instead of on the inner conductive layers 716, 726, it is possible to reduce the minimum required distance a between the upper electrically conductive element 710 and the lower carrier substrate 720. Dispensing with bond wires or bond tapes between the power terminals 701, 703 and the conductive layers 716, 726 can likewise contribute to the fact that the distance a can be reduced. In this way, it is possible to produce a flatter semiconductor package.

FIG. 9A shows that a gap 901 between the first and third power terminals 701, 703 is an air gap. However, it is also possible for the gap 901 to be filled with a dielectric, e.g. in order to increase the electrical isolation between the power terminals 701, 703. The dielectric can be e.g. a film or a molding compound such as the encapsulation body 730, for instance.

FIG. 9B shows a perspective view of one example of the upper electrically conductive element 710, wherein component parts such as terminals, for instance, have been omitted for the sake of clarity. The inner conductive layer 716 has a cutout 902 designed to receive the third power terminal 703. The cutout 902 can have any suitable shape (the third power terminal 703 having the same shape), e.g. a toothing as shown in FIG. 9B.

Figure 9C:
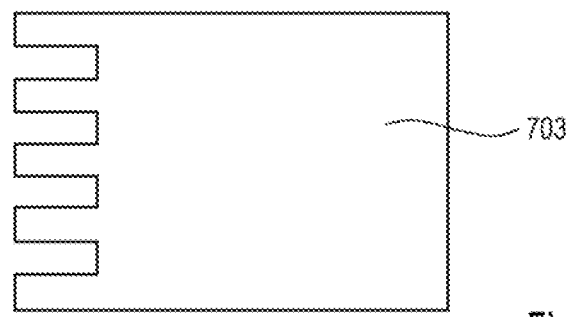
FIG. 9C illustrates a plan view of a power terminal.

FIG. 9C shows a plan view of one example of the third power terminal 703 shaped such that it fits into the cutout 902. The toothing can contribute to improving the electrical and mechanical contact between the third power terminal 703 and the inner conductive layer 726.

The first power terminal 701 can be configured analogously to the third power terminal 703 and can be secured to the lower carrier substrate 720 at a cutout analogous to the cutout 902. In accordance with one example, it is also possible for the second power terminal 702 to be secured to the lower carrier substrate 720 in a cutout like the cutout 902.

Although specific embodiments have been illustrated and described herein, it is obvious to the person of average skill in the art that a multiplicity of alternative and/or equivalent implementations can replace the specific embodiments shown and described, without departing from the scope of the present disclosure. This application is intended to cover all adaptations or variations of the specific embodiments discussed herein. Therefore, the intention is for this disclosure to be restricted only by the claims and the equivalents thereof.

What is claimed is:

1. A double-sided coolable semiconductor package, comprising:
    an encapsulant body of electrically insulating mold compound;
    a first electrically conductive element having an outwardly exposed metal surface that is exposed from a first side of the encapsulant body;

a first carrier substrate having a first electrically conductive layer, a second electrically conductive layer having an outwardly exposed surface that is exposed from a second side of the encapsulant body that is opposite from the first side, and an electrical insulation layer arranged between the first and second electrically conductive layers;

a first electrically conductive spacer arranged between the first electrically conductive element and the first electrically conductive layer;

a power semiconductor chip arranged between the first electrically conductive element and the first electrically conductive layer; and a second electrically conductive spacer arranged between the first electrically conductive element and the power semiconductor chip, wherein a first carrier region of the first electrically conductive layer of the first carrier substrate is electrically connected to a first power terminal of the double-sided coolable semiconductor package, wherein a second carrier region of the first electrically conductive layer of the first carrier substrate is arranged alongside the first carrier region and is electrically connected to a second power terminal of the double-sided coolable semiconductor package, wherein a first region of the first electrically conductive element is connected to a third power terminal of the double-sided coolable semiconductor package.

2. The double-sided coolable semiconductor package of claim 1, wherein the outwardly exposed metal surface of the first electrically conductive element and the first side of the encapsulant body form a first outer surface of the semiconductor package, and wherein an outwardly exposed metal surface of a second electrically conductive element and the second side of the encapsulant body form a second outer surface of the semiconductor package.

3. The double-sided coolable semiconductor package of claim 1, wherein the first power terminal is a first lead that protrudes out of the encapsulant body, and wherein the third power terminal is a second lead that protrudes out of the encapsulant body.

4. The double-sided coolable semiconductor package of claim 1, wherein the first electrically conductive element has a second carrier substrate comprising a third electrically conductive layer, a fourth electrically conductive layer and an electrical insulation layer arranged between the third and fourth electrically conductive layers, and wherein the third electrically conductive layer corresponds to the outwardly exposed metal surface that is exposed from the first side of the encapsulant body.

5. The double-sided coolable semiconductor package of claim 1, wherein the first carrier region has a U-shaped geometry, and wherein the second carrier region is surrounded by the first carrier region.

6. The double-sided coolable semiconductor package of claim 1, wherein a third region of the first electrically conductive element is electrically connected to the second carrier region.

7. The double-sided coolable semiconductor package of claim 1, wherein a fourth region of the first electrically conductive element is electrically connected to a control electrode of the power semiconductor chip.

8. The double-sided coolable semiconductor package of claim 1, wherein the first carrier region is at least partly surrounded at three sides by a signal line on the first electrically conductive layer of the first carrier substrate, and wherein the signal line is configured to apply a control voltage.

9. The double-sided coolable semiconductor package of claim 1, further comprising a control terminal and a measurement terminal,
wherein the first, second, and third power terminals are arranged at a first side of the double-sided coolable semiconductor package,
wherein the control terminal and the measurement terminal are arranged at a second side of the double-sided coolable semiconductor package opposite the first side.

10. The double-sided coolable semiconductor package of claim 9, wherein the first power terminal, the second power terminal, the third power terminal, the control terminal, and the measurement terminal are part of a leadframe.

11. The double-sided coolable semiconductor package of claim 1, wherein the power semiconductor chip comprises SiC.

12. The double-sided coolable semiconductor package of claim 1, further comprising:
a buffer capacitor arranged on the first carrier region.

13. A double-sided coolable semiconductor package, comprising:
a first electrically conductive element having an outwardly exposed metal surface;
a first carrier substrate having a first electrically conductive layer, a second electrically conductive layer having an outwardly exposed surface, and an electrical insulation layer arranged between the first and second electrically conductive layers;
a first electrically conductive spacer arranged between the first electrically conductive element and the first electrically conductive layer;
first and second power semiconductor chips arranged between the first electrically conductive element and the first electrically conductive layer; and
a second electrically conductive spacer arranged between the first electrically conductive element and the first power semiconductor chip,
wherein the first and second semiconductor chips are arranged in a half-bridge circuit such that the first semiconductor chip is a high-side power semiconductor chip of the half-bridge circuit and such that the second semiconductor chip is a low-side power semiconductor chip of the half-bridge circuit,
wherein a first carrier region of the first electrically conductive layer of the first carrier substrate is configured to apply a first supply voltage to the first semiconductor chip,
wherein a second carrier region of the first electrically conductive layer of the first carrier substrate is arranged alongside the first carrier region and is configured as a phase node of the half-bridge circuit,
wherein a first region of the first electrically conductive element is configured to apply a second supply voltage to the second semiconductor chip.

* * * * *

UNITED STATES PATENT AND TRADEMARK OFFICE
CERTIFICATE OF CORRECTION

PATENT NO. : 12,266,586 B2
APPLICATION NO. : 17/844455
DATED : April 1, 2025
INVENTOR(S) : J. Hoegerl et al.

Page 1 of 1

It is certified that error appears in the above-identified patent and that said Letters Patent is hereby corrected as shown below:

On the Title Page

Item (56)/Foreign Pat. Docs. (Line 1), please change "102070695" to -- 105070695 --.

Signed and Sealed this
Thirteenth Day of May, 2025

Coke Morgan Stewart
*Acting Director of the United States Patent and Trademark Office*